(12) United States Patent
Nogami

(10) Patent No.: US 6,710,447 B1
(45) Date of Patent: Mar. 23, 2004

(54) INTEGRATED CIRCUIT CHIP WITH HIGH-ASPECT RATIO VIAS

(75) Inventor: Takeshi Nogami, Kanagawa (JP)

(73) Assignee: Advanced Micro Devices, Inc., Sunnyvale, CA (US)

( * ) Notice: Subject to any disclaimer, the term of this patent is extended or adjusted under 35 U.S.C. 154(b) by 77 days.

(21) Appl. No.: 09/579,340

(22) Filed: May 25, 2000

Related U.S. Application Data

(60) Provisional application No. 60/154,407, filed on Sep. 17, 1999.

(51) Int. Cl.$^7$ ................................................ H01L 23/48
(52) U.S. Cl. ........................................ 257/758; 257/774
(58) Field of Search .................................. 257/758, 774, 257/752, 751, 773; 438/618, 622, 627, 638, 701, 640

(56) References Cited

U.S. PATENT DOCUMENTS 5,629,237 A * 5/1997 Wang et al. ................. 438/701

* cited by examiner

Primary Examiner—Long Pham
Assistant Examiner—(Vikki) Hoa B. Trinh
(74) Attorney, Agent, or Firm—Mikio Ishimaru

(57) ABSTRACT

An integrated circuit is provided with high-aspect ratio vias in which the upper channel after lining with an adhesion/barrier layer is used as a collimator with a via entrant angle of greater than about 70 degrees during the ionized metal plasma deposition of the seed layer over the adhesion/barrier layer. This results in a seed layer with reduced overhang in the vias enhancing the subsequent filling of the vias by a conductive layer and preventing the formation of voids in the vias.

20 Claims, 3 Drawing Sheets

INTEGRATED CIRCUIT CHIP WITH HIGH-ASPECT RATIO VIAS

CROSS REFERENCE TO RELATED APPLICATION

This application claims the benefit of U.S. Provisional Patent Application 60/154,407 filed on Sep. 17, 1999, which is incorporated herein by reference thereto.

TECHNICAL FIELD

The present invention relates generally to integrated circuit chips and more specifically to an integrated circuit chip with high-aspect ratio vias where the vias are filled using a channel collimator effect

BACKGROUND ART

While manufacturing integrated circuits, after the individual devices, such as the transistors, have been fabricated in the silicon substrate, they must be connected together to perform the desired circuit functions. This interconnection process is generally called "metalization", and is performed using a number of different photolithographic and deposition techniques.

One metalization process, which is called the "damascene" technique starts with the placement of a first channel dielectric layer, which is typically an oxide layer, over the semiconductor devices. A first damascene step photoresist is then placed over the oxide layer and is photolithogaphically processed to form the pattern of the first channels. An anisotropic oxide etch is then used to etch out the channel oxide layer to form the first channel openings. The damascene step photoresist is stripped and a barrier layer is deposited to coat the walls of the first channel opening to ensure good adhesion and to act as a barrier material to prevent diffusion of such conductive material into the oxide layer and the semiconductor devices (the combination of the adhesion and barrier material is collectively referred to as "barrier layer" herein). A seed layer is then deposited on the barrier layer to form a conductive material base, or "seed", for subsequent deposition of conductive material. A conductive material is then deposited in the first channel openings and subjected to a chemical-mechanical polishing process which removes the first conductive material above the first channel oxide layer and damascenes the conductive material in the first channel openings to form the first channels.

For multiple layers of channels, another metalization process, which is called the "dual damascene" technique, is used in which the channels and vias are formed at the same time. In one example, the via formation step of the dual damascene technique starts with the deposition of a thin stop nitride over the fist channels and the first channel oxide layer. Subsequently, a separating oxide layer is deposited on the stop nitride. This is followed by deposition of a thin via nitride.

A via step photoresist is used in a photolithographic process to designate via areas over the first channels. A nitride etch is then used to etch out the round via areas in the via nitride. The via step photoresist is then removed, or stripped. A second channel dielectric layer, which is typically an oxide layer, is then deposited over the via nitride and the exposed oxide in the via area of the via nitride. A second damascene step photoresist is placed over the second channel oxide layer and is photolithographically processed to form the pattern of the second channels. An anisotropic oxide etch is then used to etch the second channel oxide layer to form the second channel openings and, during the same etching process to etch the via areas down to the thin stop nitride layer above the first channels to form the via openings. The damascene photoresist is then removed, and a nitride etch process removes the nitride above the first channels in the via areas.

After the via is formed, an adhesion/barrier layer is then deposited to coat the via openings and the second channel openings. Next, a seed layer is deposited on the adhesion/barrier layer. This is followed by a deposition of the conductive material in the second channel openings and the via openings to form the second channel and the via. A second chemical-mechanical polishing process leaves the two vertically separated, horizontally perpendicular channels connected by a cylindrical via The use of the damascene techniques eliminates metal etch and dielectric gap fill steps typically used in the metalization process. The elimination of metal etch steps is important as the semiconductor industry moves from aluminum to other metalization materials, such as copper, which are very difficult to etch.

One drawback of using copper is that copper diffuses rapidly through various materials. Unlike aluminum, copper also diffuses through dielectrics, such as oxide. When copper diffuses through dielectrics, it can cause damage to neighboring devices on the semiconductor substrate. Thus, a thin adhesion layer formed of an adhesion material, such as titanium, is first deposited on the dielectric in the channels and vias to ensure good adhesion and good electrical contact of the subsequently deposited adhesion/barrier layers to underlying doped regions and/or conductive channels. This is followed by the barrier layer to prevent diffusion, materials such as tantalum nitride (TaN), titanium nitride (TiN), or tungsten nitride (WN) are used as barrier materials for copper. Adhesion/barrier layer stacks formed of adhesion/barrier materials such as tantalum/tantalum nitride (Ta/TaN), titanium/titanium nitride (Ti/TiN), and tungsten/tungsten nitride (W/WN) have been found to be useful as adhesion/barrier material combination for copper interconnects. In some cases, no adhesion layer is placed between the barrier and oxide. For example, only TaN monolayer is used sometimes because the TaN has good adhesion to the oxide.

After deposition of the adhesion/barrier material, a seed layer is deposited by ionized metal plasma (IMP) deposition. Generally, the metal deposited is copper or a copper alloy. The copper seed layer provides an electrode for the subsequent copper electroplating which will fill the channels and vias.

The common problems associated with most of the seed layer deposition techniques are poor sidewall step coverage and conformality, i.e., the seed layer thickness is much higher in wide-open areas, such as on top of the channel oxide layer, in the upper portion of the sidewalls of the channels and vias, and bottom of the channels than in the lower portion of the sidewalls of the channels and vias. To guarantee a minimum seed layer thickness anywhere in the channel or vias, including at the lower portion of the sidewalls, the seed layer thickness in wide-open areas tends to be much higher. As the width of the channels and vias have decreased in size due to the size reduction in the semiconductor devices, an excessively thick seed layer in the wide-open areas interferes with the subsequent filling of the channel and vias with conductive materials leading to the formation of voids. These voids lead to connection and electro-migration failures.

A solution, which would form uniform seed layers in vias and result in an improvement in the subsequent filling of the vias by conductive materials, has long been sought, but has eluded those skilled in the art. As the semiconductor industry moves from aluminum to copper and other types of high conductivity materials, it is becoming more pressing that a solution be found.

DISCLOSURE OF THE INVENTION

The present invention provides an integrated circuit with high-aspect ratio vias in which the upper channel is used as a collimator for the vias during the ionized metal plasma deposition of the seed layer. This results in a seed layer with reduced overhang in the vias enhancing the subsequent filling of the vias by a conductive layer and preventing the formation of voids in the vias.

The present invention further provides an integrated circuit with high-aspect ratio vias in which the upper channel after lining with an adhesion/barrier layer is used as a collimator for the vias during the ionized metal plasma deposition of the seed layer over the adhesion/barrier layer. This results in a seed layer with reduced overhang in the vias enhancing the subsequent filling of the vias by a conductive layer and preventing the formation of voids in the vias.

The present invention further provides an integrated circuit with high-aspect ratio vias in which the upper channel is used as a collimator with a via entrant angle of greater than about 69 degrees during the ionized metal plasma deposition of the seed layer. This results in a seed layer with reduced overhang in the vias enhancing the subsequent filling of the vias by a conductive layer and preventing the formation of voids in the vias.

The present invention further provides an integrated circuit with high-aspect ratio vias in which the upper channel after lining with an adhesion/barrier layer is used as a collimator with a via entrant angle of greater than about 70 degrees during the ionized metal plasma deposition of the seed layer over the adhesion/barrier layer. This results in a seed layer with reduced overhang in the vias enhancing the subsequent filling of the vias by a conductive layer and preventing the formation of voids in the vias.

The above and additional advantages of the present invention will become apparent to those skilled in the art from a reading of the following detailed description when taken in conjunction with the accompanying drawings.

BEST MODE FOR CARRYING OUT THE INVENTION

Figure 1A:
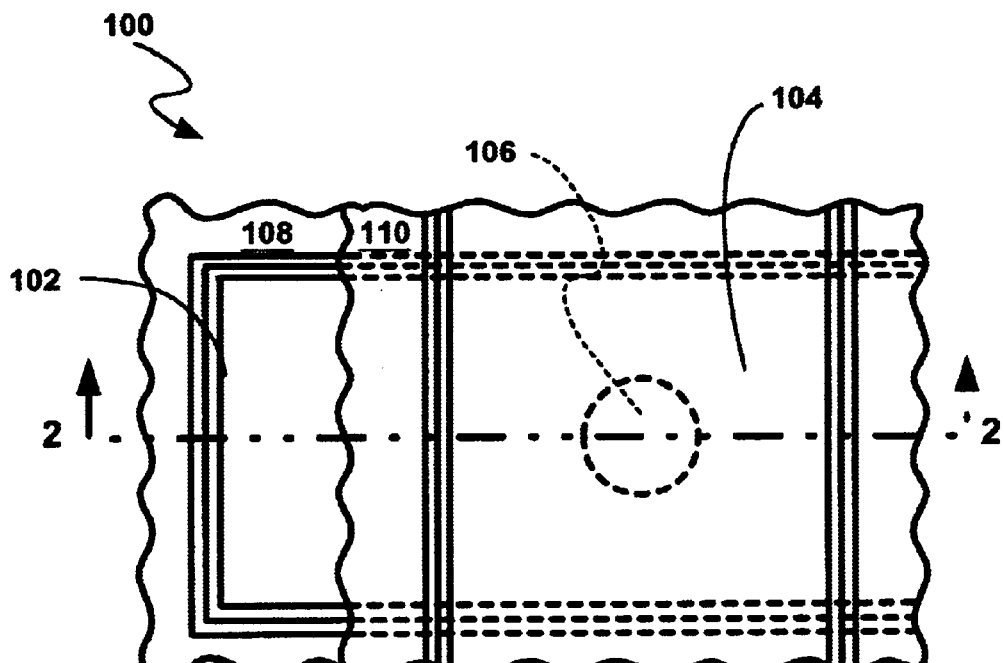
FIG. 1A (PRIOR ART) is a plan view of aligned channels with a prior art via.

Referring now to FIG. 1A (PRIOR ART), therein is shown a plan view of a prior art pair of aligned semiconductor channels of a conductive material disposed over a semiconductor wafer 100. A first channel 102 is shown disposed below a second channel 104 which extends substantially perpendicular to the first channel 102 in the plan view. A round, high-aspect ratio via 106 connects the first and second channels 102 and 104 and is a part of the second channel 104. The via is considered a high-aspect via because the diameter is much smaller than the depth with a ratio exceeding 1:2. The first channel 102 is damascened into a first channel dielectric layer 108, and the second channel 104 is damascened into a second channel dielectric layer 10.

Figure 1B:
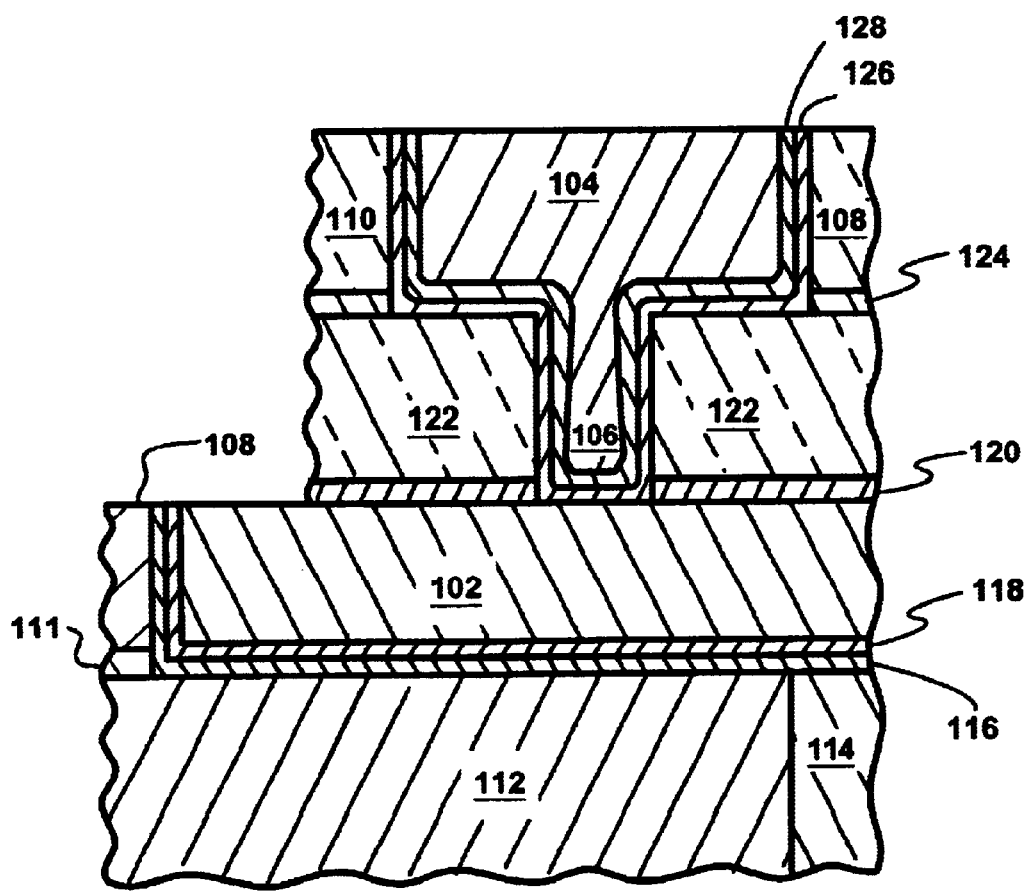
FIG. 1B (PRIOR ART) is a cross-section of FIG. 1A (PRIOR ART) along line 2—2.

Referring now to FIG. 1B (PRIOR ART), therein is shown a cross section of FIG. 1A (PRIOR ART) along 2—2. The first channel 102 is through a first stop etch layer 111 over a polysilicon gate 112 and a dielectric layer 114 of an integrated circuit chip (not shown). The first channel 102 is disposed in an first adhesion/barrier layer 116 and a first seed layer 118, both of which are conductive and place the second channel 102 in operative contact with the polysilicon gate. The first and second channels 102 and 104 are in horizontal planes separated vertically by a via stop nitride layer 120 and a via dielectric layer 122.

The second channel 104 is in the second channel dielectric layer 110 and extends through a second channel stop nitride layer 124, as does the via 106, through the via dielectric layer 122. Also shown disposed around the second channel 104 and the via 106 are an adhesion/barrier layer 126 and seed layer 128 which extend through the via stop nitride 120 to contact the first channel 102.

Figure 1C:
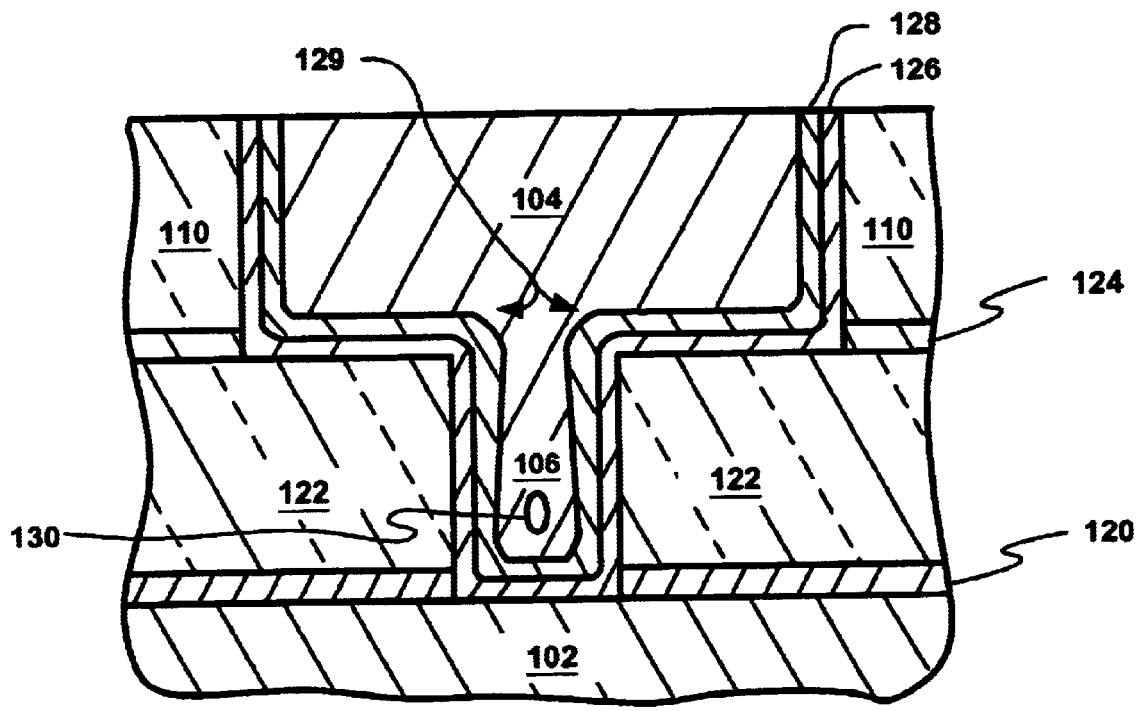
FIG. 1C (PRIOR ART) is a close up of FIG. 1B (PRIOR ART) showing a void in a via.

Referring now to FIG. 1C (PRIOR ART), therein is shown a close-up cross section of the semiconductor wafer 100 along 2—2 after the deposition of the adhesion/barrier layer 126, the seed layer 128, the second channel 104, and the via 106. For purpose of clarity, the first adhesion/barrier layer 116, first seed layer 118, polysilicon gate 112, and dielectric layer 114 are not shown.

The common problems associated with most of physical vapor deposition (PVD) and ionized metal plasma (IMP) techniques are poor sidewall step coverage and conformality, i.e., the seed layer thickness is much higher in wide-open areas, such as on top of the via dielectric layer 122 and in the upper portion of the via 106.

To guarantee a minimum seed layer thickness at the bottom of the via 106, the seed layer thickness in the wide-open areas tends to be much thicker. As the widths of the channels and vias have decreased in size due to the size reduction in the semiconductor devices, the via rim overhang 129 which occurs at the entrance to the via 106 has become more and more significant. The overhang 129 is created by the fusibility of the conductive material of the seed layer 128 during the PVD and IMP processes striking the adhesion/barrier layer 126 at the rim of the via opening at angles less than 69 degrees. An excessively thick seed layer in the upper portion of the via 106 interferes with the subsequent filling of the via 106 and causes a void, such as the void 130, to form towards the bottom of the via 106. This void 130 is extremely detrimental to reliable operation of the semiconductor device. The void causes a reduced cross-sectional area of the via 106, which results in reduced current carrying capability and also more rapid electromigration of conductive material around the void 130 so as to cause an open circuit condition.

Figure 2:
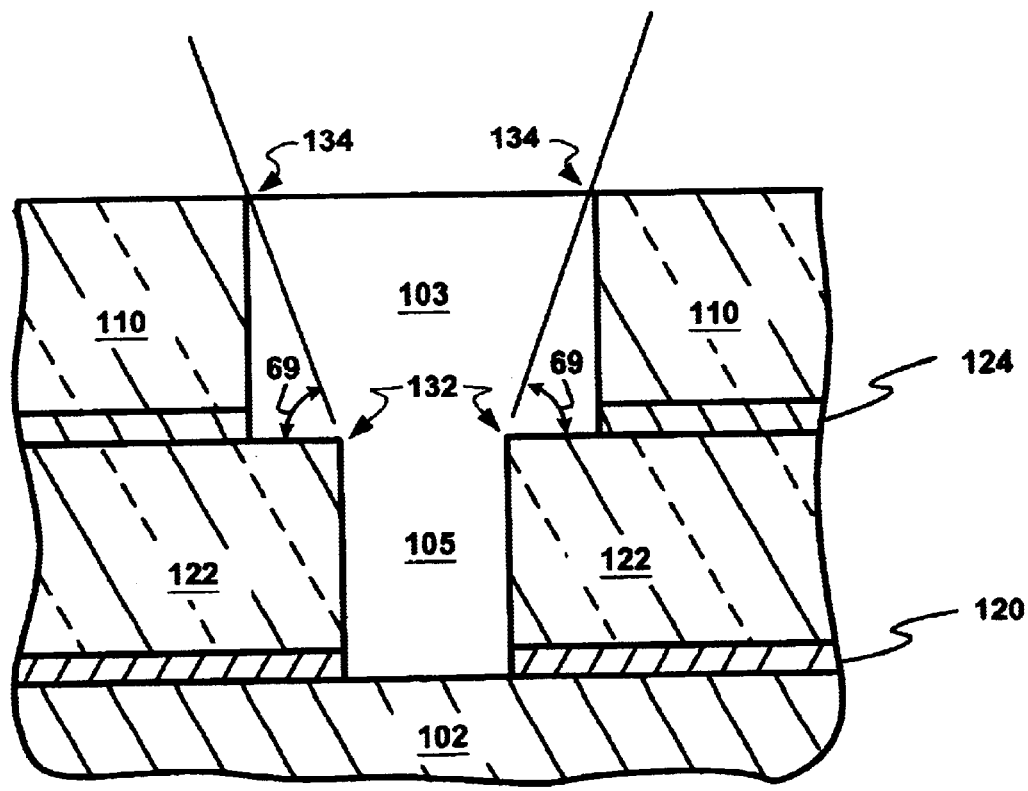
FIG. 2 is a cross section of a channel and via of the present invention showing a critical angle.

Referring to FIG. 2, therein is shown a cross section of the present invention in a configuration similar to that shown in FIG. 1A (PRIOR ART) but prior to the deposition of the second channel 104 and the via 106. For convenience of illustration, like reference numerals are used in FIG. 2 to denote like elements already described in FIG. 1A (PRIOR ART) through FIG. 1C (PRIOR ART). Similarly, for purposes of clarity, the first adhesion/barrier layer 116, first seed layer 118, polysilicon gate 112, and dielectric layer 114 are not shown.

At this stage, a second channel opening 103 and a via opening 105 have been formed. The via opening 105 has a cylindrical rim 132 while the second channel opening 103 has two parallel linear second channel rims 134. The angle between the edge of the via rim 132 and the second channel rims 134 is designated as a via entrant angle 69. As will be later explained, the via entrant angle 69 should be greater than about 69 degrees. As will be noted, the width of the second channel opening 103 is significantly narrower than the width of the second channel 104 because of the via entrant angle 69.

Figure 3:
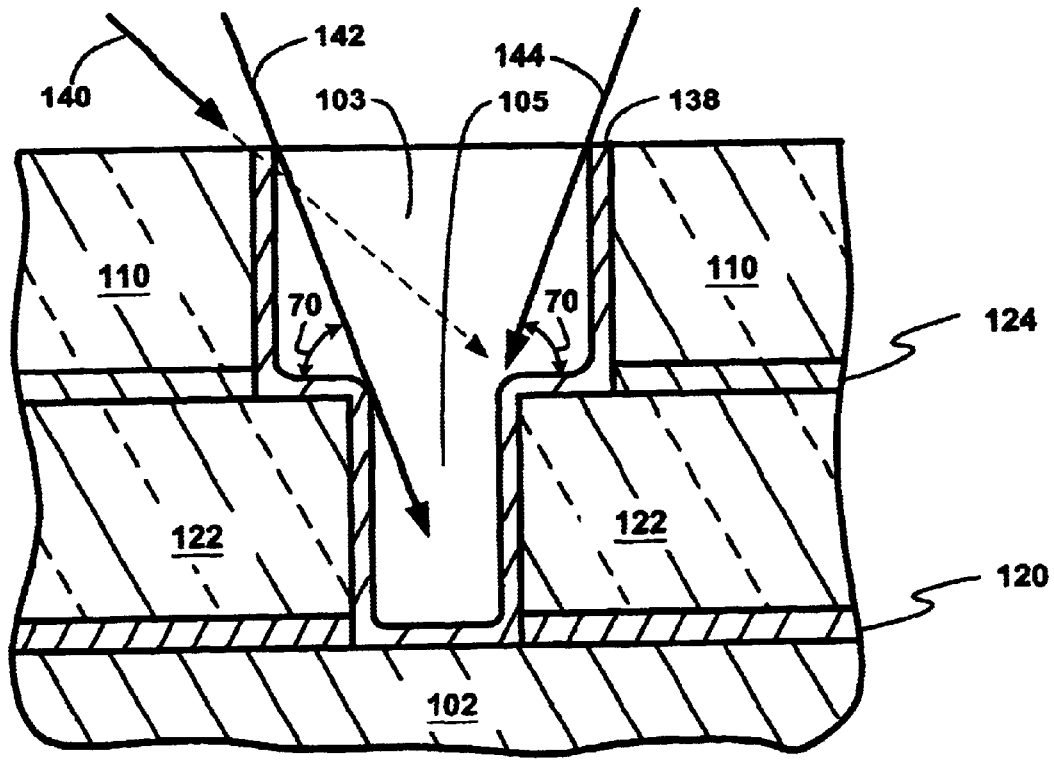
FIG. 3 shows the structure of FIG. 2 after deposition of an adhesion/barrier layer and a further critical angle.

Referring now to FIG. 3, therein is shown the structure of FIG. 2 after PVD or IMP deposition of a second adhesion/barrier layer 138. The rays 140, 142, and 144 indicate the directions of the metal flux being used to deposit the second seed layer 146. In order to reach the bottom of the via opening 105, a second seed layer ion, such as ray 142, must enter at a via entrant angle 70 at least as great as about 70 degrees. The via entrant angle 70 causes the second adhesion/barrier layer 138 along the rim 134 of the second channel opening 103 to act as a collimator for the metal flux.

Figure 4:
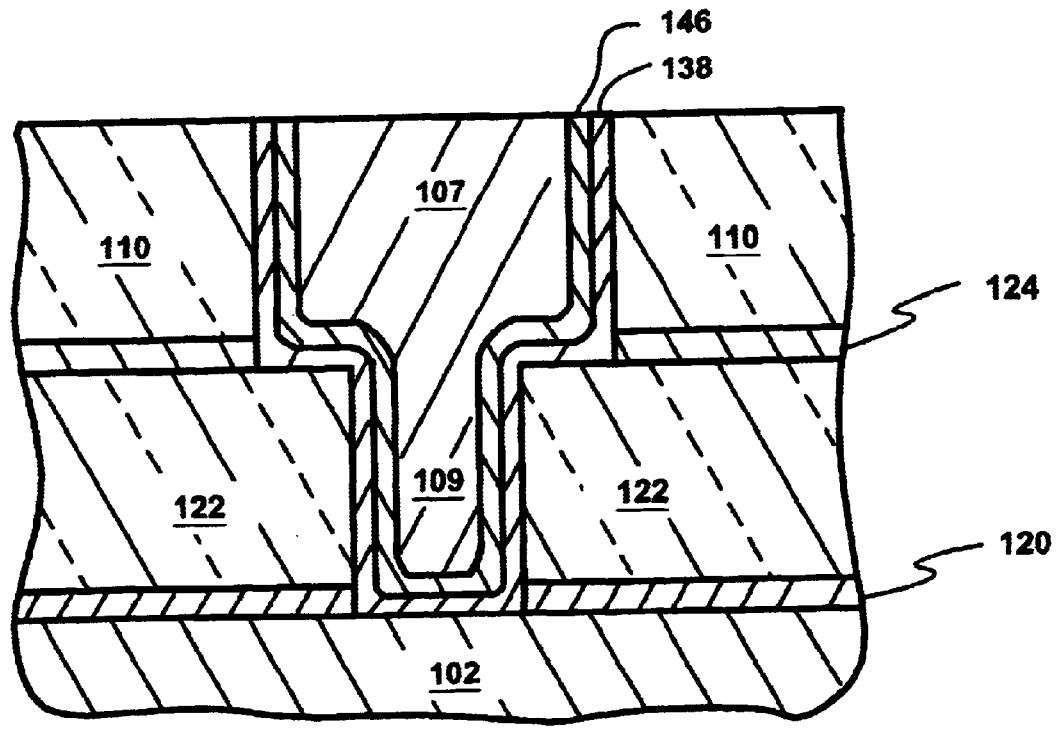
FIG. 4 is a ross section of a channel and voidless via of the present invention.

Referring now to FIG. 4, therein is shown the structure of FIG. 2 after deposition of the second adhesion/barrier layer 138, the second seed layer 146, the second channel 107, and the via 109. In the present invention, the via 109 is not subject to the formation of voids.

In manufacture, both the structure of FIG. 1C (PRIOR ART) and FIG. 4 use exactly the same steps. Essentially, the first stop nitride layer 111 is deposited over the semiconductor device followed by the first channel dielectric layer 108. A photolithographic process then uses a mask to define the openings for the first channel 102. The openings are then etched into the first channel dielectric 124. A damascene process is then used to fill the channels by a process of lining the first channel opening with the first adhesion/barrier layer 116 followed by a PVD or IMP step for the first seed layer 118. A conductive material is then electroplated onto the fit seed layer 118 to overfill the first channel opening. A chemical-mechanical polishing process is then used to remove the conductive material above the first channel dielectric 108 and leave the conductive material to form the first channel 102. A via stop nitride layer 120 is deposited and patterned and etched to provide the via opening to the first channel 102. This is followed by the deposition of the via dielectric layer 122, the second channel stop nitride layer 124, and the second channel dielectric layer 110. The second channel dielectric layer 110 is then photolithographically processed and etched to form the second channel opening 103 and the via opening 105, shown in FIG. 2.

In the present invention, the second channel opening 103 is configured so that its width at the rims 134 form the via entrant angle 69 with the rim 132 of the via opening 105. This causes the rims 134 to act as a collimator for subsequent plasma or ion deposition processes where the deposition of the second adhesion/barrier layer 138 requires this "channel collimator effect".

For deposition of the second seed layer 146, the metal flux of seed material, such as rays 142 and 144, are able to enter the via opening 105 where the channel collimator effect is caused by the second adhesion/barrier layer 138 over the rims 134. The metal flux with angles less than 70 degrees, such as shown by the ray 140 with its dotted line extension, will not be able to impact on the adhesion/barrier material on the rim 132 and constrict the top portion of the via opening 105. On the other hand, those rays, such as 142 and 144 which are close to being parallel to the axis of the via 105, will be collimated and will be able to enter and provide uniform seed layer coverage of the via 105 down to the bottom.

It has been determined that in order to achieve the channel collimator effect, it is necessary that the via entrant angle 69 from the rims 132 to the rim 134 as shown in FIG. 2, must be approximately 69 degrees or greater so as to provide the via entrant angle 70 as shown in FIG. 3 of at least 70 degrees over the adhesion/barrier layer 138. As would be evident, with higher aspect vias where the depth is much greater than the via diameter, the via entrant angle should be increased.

Once the second seed layer 146 is formed, an electroplating process is used to deposit the conductive material to form the second channel 107 and the via 109. As previously explained, the via 109 will not be subject to the formation of voids.

As would be evident to those skilled in the art, the via entrant angles are a function of the channel depth, and the cross-sectional area of the second channel 107 would still be sufficient to accommodate any current flow required through the via 109. Further, the current carrying capacity of the second channel 107 can be increased by making it deeper, which would also increase the channel collimation effect.

Examples of suitable seed materials and conductive materials include aluminum, copper, gold, silver, alloys thereof, and combinations thereof.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. An integrated circuit chip comprising:
   a semiconductor substrate;
   a semiconductor device over said semiconductor substrate;
   a dielectric layer formed over said semiconductor substrate and said semiconductor device, said dielectric layer having a channel opening and a via provided therein, said via having a via entrant angle formed from a rim of said channel opening to a rim of the via and a horizontal bottom of the channel opening of greater than about 69 degrees whereby said channel opening forms a collimator for said via and a depth and a cross-sectional area of the channel opening are determined by the via entrant angle;
   a seed layer lining said channel opening and said via; and
   a conductive layer damascened into said seed layer and said dielectric layer whereby said conductive layer in said channel opening is operatively connected by said conductive layer in said via to said semiconductor device without voids.

2. The integrated circuit chip as claimed in claim 1 including:
   an adhesion/barrier layer disposed between said dielectric layer and said seed layer in said channel opening and said via, said via with said adhesion/barrier layer having an adhesion/barrier layer via entrant angle formed with an adhesion/barrier layer channel opening of greater than about 70 degrees whereby said adhesion/barrier channel opening forms a collimator for said adhesion/barrier layer via.

3. The integrated circuit chip as claimed in claim 2 including:
said adhesion/barrier layer deposited by a process selected from a group comprising physical vapor deposition, chemical vapor deposition, and a combination thereof.

4. The integrated circuit chip as claimed in claim 3 wherein:
said adhesion/barrier layer of a material selected from a group comprising titanium, tantalum, tungsten, titanium nitride, tantalum nitride, tungsten nitride, and a combination thereof.

5. The integrated circuit chip as claimed in claim 1 wherein:
said seed layer is formed by ionized metal plasma deposition.

6. The integrated circuit chip as claimed in claim 5 wherein:
said seed layer is formed of a material selected from a group comprising aluminum, copper, gold, silver, an alloy thereof, and a combination thereof.

7. The integrated circuit chip as claimed in claim 6 wherein:
said conductive layer is deposited by a process of electroplating.

8. The integrated circuit chip as claimed in claim 1 wherein:
said conductive layer is formed of a material selected from a group comprising aluminum, doped polysilicon, copper, gold, silver, an alloy thereof, and a combination thereof.

9. The integrated circuit chip as claimed in claim 1 wherein:
said via has a high-aspect ratio.

10. The integrated circuit chip as claimed in claim 1 wherein:
said seed layer is of a relatively uniform thickness in said channel opening and said via.

11. An integrated circuit chip comprising:
a semiconductor substrate;
a semiconductor device on said semiconductor substrate;
a first channel dielectric layer formed over said semiconductor substrate and said semiconductor device, said first channel dielectric layer having a first channel opening provided therein;
a first seed layer lining said first channel opening in said first channel dielectric layer;
a first conductive layer damascened into said first seed layer and said first channel dielectric layer whereby said conductive layer in said first channel opening is operatively connected to said semiconductor device;
second channel and via dielectric layers formed over said first channel dielectric layer, said second channel and via dielectric layers having a second channel opening and a via provided therein, said via having a via entrant angle formed from a rim of said second channel opening to a rim of the via and a horizontal bottom of the channel opening of greater than about 69 degrees whereby said second channel opening forms a collimator for said via and a depth and a cross-sectional area of the second channel opening are determined by the via entrant angle;
a second seed layer lining said second channel opening and said via; and
a second conductive layer damascened into said second seed layer and said second channel dielectric and via layers whereby said second conductive layer in said second channel opening is connected by said second conductive layer in said via to said first conductive layer in said first channel without voids.

12. The integrated circuit chip as claimed in claim 11 including:
a second adhesion/barrier layer disposed between said second channel dielectric layer and said second seed layer in said second channel opening and said via, said via with said adhesion/barrier layer having an adhesion/barrier layer via entrant angle formed with an adhesion/barrier layer channel opening of greater than about 70 degrees whereby said adhesion/barrier channel opening forms a collimator for said adhesion/barrier layer via.

13. The integrated circuit chip as claimed in claim 12 including:
said second adhesion/barrier layer deposited by a process selected from a group comprising physical vapor deposition, chemical vapor deposition, and a combination thereof.

14. The integrated circuit chip as claimed in claim 13 wherein:
said second adhesion/barrier layer of a material selected from a group comprising titanium, tantalum, tungsten, titanium nitride, tantalum nitride, tungsten nitride, and a combination thereof.

15. The integrated circuit chip as claimed in claim 11 wherein:
said second seed layer is formed by ionized metal plasma deposition.

16. The integrated circuit chip as claimed in claim 15 wherein:
said second seed layer is formed of a material selected from a group comprising aluminum, copper, gold, silver, an alloy thereof, and a combination thereof.

17. The integrated circuit chip as claimed in claim 16 wherein:
said second conductive layer is deposited by a process of electroplating on said second seed layer.

18. The integrated circuit chip as claimed in claim 11 wherein:
said second conductive layer is formed of a material selected from a group comprising aluminum, doped polysilicon, copper, gold, silver, an alloy thereof, and a combination thereof.

19. The integrated circuit chip as claimed in claim 11 wherein:
said via has a high-aspect ratio of diameter to depth in excess of 1:2.

20. The integrated circuit chip as claimed in claim 11 wherein:
said second seed layer is of a relatively uniform thickness in said second channel opening and in said via.

* * * * *

UNITED STATES PATENT AND TRADEMARK OFFICE
CERTIFICATE OF CORRECTION

PATENT NO. : 6,710,447 B1
DATED : March 23, 2004
INVENTOR(S) : Nogami

It is certified that error appears in the above-identified patent and that said Letters Patent is hereby corrected as shown below:

Column 1,
Line 30, delete "photolithogaphically" and insert therefore -- photolithographically --
Line 53, delete "fist" and insert therefore -- first --

Column 3,
Line 58, delete "ross" and insert therefore -- cross --

Column 4,
Line 9, delete "10" and insert therefore -- 110 --

Column 5,
Line 42, delete "fit" and insert therefore -- first --

Signed and Sealed this

Seventh Day of June, 2005

JON W. DUDAS
*Director of the United States Patent and Trademark Office*